US010026826B2

United States Patent
Colinge et al.

(10) Patent No.: US 10,026,826 B2
(45) Date of Patent: Jul. 17, 2018

(54) METHOD OF FORMING SEMICONDUCTOR DEVICE HAVING GATE DIELECTRIC SURROUNDING AT LEAST SOME OF CHANNEL REGION AND GATE ELECTRODE SURROUNDING AT LEAST SOME OF GATE DIELECTRIC

(71) Applicant: Taiwan Semiconductor Manufacturing Company Limited, Hsin-Chu (TW)

(72) Inventors: Jean-Pierre Colinge, Hsinchu (TW); Carlos H. Diaz, Mountain View, CA (US); Yeh Hsu, Guishan Township (TW); Tsung-Hsing Yu, Taipei (TW); Chia-Wen Liu, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/338,667

(22) Filed: Oct. 31, 2016

(65) Prior Publication Data
US 2017/0047429 A1    Feb. 16, 2017

Related U.S. Application Data

(62) Division of application No. 14/032,153, filed on Sep. 19, 2013, now Pat. No. 9,484,460.

(51) Int. Cl.
*H01L 29/66* (2006.01)
*H01L 29/739* (2006.01)
(Continued)

(52) U.S. Cl.
CPC .... *H01L 29/66712* (2013.01); *H01L 21/2251* (2013.01); *H01L 29/068* (2013.01);
(Continued)

(58) Field of Classification Search
CPC ........... H01L 29/66356; H01L 29/7391; H01L 29/0673; H01L 29/0676; H01L 29/068;
(Continued)

(56) References Cited

U.S. PATENT DOCUMENTS 6,348,642 B1   2/2002   Knauf et al.
6,744,083 B2   6/2004   Chen et al.
(Continued)

FOREIGN PATENT DOCUMENTS

CN    101443912 A    5/2009
JP    2008160125    7/2008
(Continued)

OTHER PUBLICATIONS

Vitale, et al., "Monte Carlo Study of Transport Properties in Junctionless Transistors", Oct. 26, 2010, Computational Electronics (IWCE), 2010 14th International Workshop on, pp. 1-3, http://ieeexplore.ieee.org/xpl/login.jsp?tp=&arnumber=5677969&url=http%3A%2F%2Fieeexplore.ieee.org%2Fxpls%2Fabs_all.jsp%3Farnumber%3D5677969.
(Continued)

*Primary Examiner* — Stephen W Smoot
*Assistant Examiner* — Vicki B Booker
(74) *Attorney, Agent, or Firm* — Cooper Legal Group, LLC

(57) ABSTRACT

A semiconductor device includes a first type region including a first conductivity type and a second type region including a second conductivity type. The semiconductor device includes a channel region extending between the first type region and the second type region. The semiconductor device includes a gate electrode surrounding at least some of the channel region. A first gate edge of the gate electrode is separated a first distance from a first type region edge of the first type region and a second gate edge of the gate electrode
(Continued)

is separated a second distance from a second type region edge of the second type region. The first distance is less than the second distance.

20 Claims, 17 Drawing Sheets

(51) Int. Cl.
    *H01L 29/06*     (2006.01)
    *H01L 29/78*     (2006.01)
    *H01L 21/225*     (2006.01)
    *H01L 29/423*     (2006.01)

(52) U.S. Cl.
    CPC ...... *H01L 29/0673* (2013.01); *H01L 29/0676* (2013.01); *H01L 29/42392* (2013.01); *H01L 29/66356* (2013.01); *H01L 29/66787* (2013.01); *H01L 29/7391* (2013.01); *H01L 29/785* (2013.01)

(58) Field of Classification Search
    CPC ............... H01L 29/785; H01L 21/2251; H01L 29/42392; H01L 29/66712; H01L 29/66787
    See application file for complete search history.

(56) References Cited

U.S. PATENT DOCUMENTS

| 8,796,094 B2* | 8/2014 | Eguchi | H01L 29/66712 |
| --- | --- | --- | --- |
| | | | 257/E21.41 |
| 2003/0116792 A1 | 6/2003 | Chen et al. | |
| 2008/0149984 A1 | 6/2008 | Chang et al. | |

FOREIGN PATENT DOCUMENTS

| KR | 20120085928 A | 8/2012 |
| --- | --- | --- |
| WO | 2009057194 A1 | 5/2009 |

OTHER PUBLICATIONS

Sakui, et al., "A new vertical MOSFET "Vertical Logic Circuit (VLC) MOSFET" suppressing asymmetric characteristics and realizing an ultra compact and robust logic circuit", Solid-State Electronics 54 (2010) 1457-1462, journal homepage: www.elsevier.com/locate/sse.
Baek, et al., "Characteristics of Gate-all-Around Silicon Nanowire Field Effect Transistors with Asymmetric Channel Width and Source/Drain Doping Concentration", J. Appl. Phys. 112, 034513 (2012); pp. 1-23, http://jap.aip.org/resource/1/japiau/v112/i3/p034513_s1?isAuthorized=no.
Jin, et al., "A three-dimensional simulation of quantum transport in silicon nanowire transistor in the presence of electron-phonon interactions", Citation: J. Appl. Phys. 99, 123719 (2006); doi: 10.1063/1.2206885, Jun. 29, 2006, pp. 1-11, View online: http://dx.doi.org/10.1063/1.2206885.
Sato, et al., "Electrical characteristics of asymmetrical silicon nanowire field-effect transistors", Citation: Appl. Phys. Lett. 99, 223518 (2011); doi: 10.1063/1.3665261, Dec. 2, 2011, pp. 1-4, View online: http://dx.doi.org/10.1063/1.3665261.
Venugopalan, et al., "Modeling Intrinsic and Extrinsic Asymmetry of 3D Cylindrical Gate/ Gate-All-Around FETs for Circuit Simulations", 2011, pp. 1-4, http://www.eecs.berkeley.edu/~yogesh/Papers/NVMTS_Sriram.pdf.
Hsu, et al., "Electrostatics and Ballistic Transport Studies in Junctionless Nanowire Transistors", 2013, pp. 85-88, http://in4.iue.tuwien.ac.at/pdfs/sispad2013/7-3.pdf.
Corresponding Korean application 10-2013-0146910, Office Action dated Aug. 13, 2015, 15 pages.
Corresponding Korean application 10-2016-0095937, Office Action dated Sep. 26, 2016, 16 pages.
Corresponding Korean Patent Application Notice of Allowance dated Apr. 25, 2017 (7 pgs).
Akhavan et al., "Improvement of carrier ballisticity in junctionless nanowire transistors", Citation: Appl. Phys. Lett. 98, 103510 (2011); doi: 10.1063/1.3559625, Mar. 10, 2011, pp. 1-4, View online: http://dx.doi.org/10.1063/1.3559625.
Goto, et al., "Mobility and screening effect in heavily doped accumulation-mode metaloxide-semiconductor field-effect transistors", Citation: Appl. Phys. Lett. 101, 073503 (2012); doi: 10.1063/1.4745604, Aug. 14, 2012, pp. 1-3, View online: http://dx.dol.org/10.1063/1.4745604.
Rudenko, et al., "Mobility enhancement effect in heavily doped junctionless nanowire siliconon-insulator metal-oxide-semiconductor field-effect transistors", Citation: Appl. Phys. Lett. 101, 213502 (2012); doi: 10.1063/1.4767353, Nov. 21, 2012, pp. 1-5, View online: http://dx.doi.org/10.1063/1.4767353.
Abudukelimu, et al., "The Effect of Isotropic and Anisotropic Scattering in Drain Region of Ballistic Channel Diode", Solid-State and Integrated Circuit Technology (ICSICT), 2010 10th IEEE International Conference on, Nov. 1, 2010, pp. 1-3, http://ieeexplore.ieee.org/xpl/login.jsp?tp=&arnumber=5667622&url=http%3A%2F%2Fieeexplore.ieee.org%2Fxpls%2Fabs_all.jsp%3Farnumber%3D5667622.
Arora, et al., Transition of equilibrium stochastic to unidirectional velocity vectors in a nanowire subjected to a towering electric field', Citation: J. Appl. Phys. 108, 114314 (2010); doi: 10.1063/1.3514128, Dec. 10, 2010, pp. 1-9, View online: http://dx.doi.org/10.1063/1.3514128.
Gundapaneni, et al., Enhanced Electrostatic Integrity of Short-Channel Junction less Transistor With High-κ Spacers', IEEE Electron Device Letters, vol. 32, No. 10, Oct. 2011, pp. 1325-1327, http://ieeexplore.ieee.org/xpl/login.jsp?tp=&arnumber=5981375&url=http%3A%2F%2Fieeexplore.ieee.org%2Fiel5%2F55%2F6028517%2F05981375.pdf%3Farnumber%3D5981375.
Lee, et al., "Short-Channel Junctionless Nanowire Transistors", 2010, pp. 1-2, http://www.nanofunction.eu/data/document/latenews.pdf.
Lee, et al., "Performance estimation of junctionless multigate transistors", Solid-State Electronics 54 (2010) Dec. 23, 2009, pp. 97-103, journal homepage: www.elsevier.com/locate/sse.
Choi, et al., "Performance Analysis of Junctionless Transistors Based on Monte Carlo Simulation", Apr. 13, 2012, Applied Physics Express 5 (2012) 054301, pp. 1-3, http://www.lib.kobe-u.ac.jp/repository/90001669.pdf.
Fallahpour, et al., "Analytical Study of Drift Velocity in N-type Silicon Nanowires", 1st Int'l Symposium on Quality Electronic Design-Asia, 2009, pp. 252-254, Analytical Study of Drift Velocity in N-type Silicon Nariowires.
Larki, et.al., "Study of carrier velocity of lateral gate p-type silicon nanowire transistor (PSNWT)", Solid State Science and Technology Letter, vol. 17, No. 1 (2012), pp. 152-158.

* cited by examiner

US 10,026,826 B2

METHOD OF FORMING SEMICONDUCTOR DEVICE HAVING GATE DIELECTRIC SURROUNDING AT LEAST SOME OF CHANNEL REGION AND GATE ELECTRODE SURROUNDING AT LEAST SOME OF GATE DIELECTRIC

RELATED APPLICATION

This application is a divisional of and claims priority to U.S. patent application Ser. No. 14/032,153, having an amended title of "SEMICONDUCTOR DEVICE HAVING GATE DIELECTRIC SURROUNDING AT LEAST SOME OF CHANNEL REGION AND GATE ELECTRODE SURROUNDING AT LEAST SOME OF GATE DIELECTRIC" and filed on Sep. 19, 2013, which is incorporated herein by reference.

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
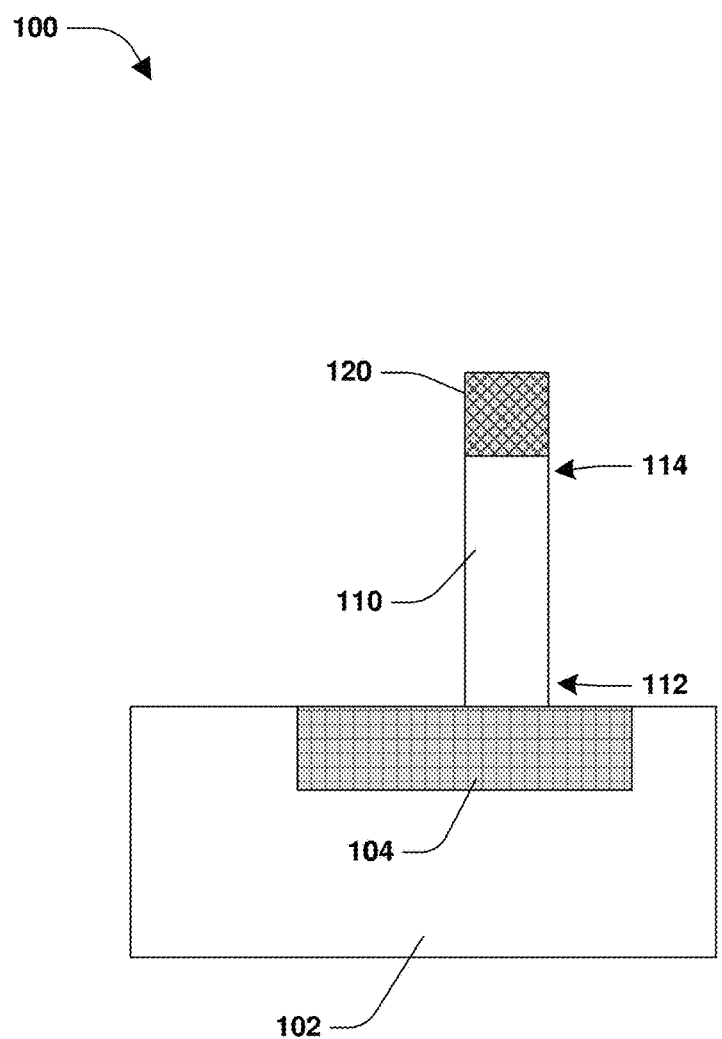
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a sectional view illustrating a semiconductor device 100 according to some embodiments. In an embodiment, the semiconductor device 100 is formed upon a well region 102. According to some embodiments, the well region 102 comprises a first conductivity type. In some embodiments, the first conductivity type comprises an n-type, such that the well region 102 comprises an n-well. In some embodiments, the first conductivity type of the well region 102 comprises a p-type, such that the well region 102 comprises a p-well. According to some embodiments, the well region 102 is formed within a substrate region (not shown). The substrate region comprises any number of semiconductor materials, such as, for example, silicon, polysilicon, germanium, etc., alone or in combination. According to some embodiments, the substrate region comprises an epitaxial layer, a silicon-on-insulator (SOI) structure, etc. According to some embodiments, the substrate region comprises an epitaxial layer, wafer, die formed from a wafer, etc.

In an embodiment, the semiconductor device 100 comprises a first type region 104. According to some embodiments, the first type region 104 is disposed within the well region 102. In an embodiment, the first type region 104 is implanted in the well region 102. In an embodiment, the first type region 104 comprises a first conductivity type. In some embodiments, the first conductivity type of the first type region 104 comprises a p-type material, p+ type material, p++ type material, p-type dopants such as Boron, Gallium, Indium, etc., alone or in combination. In some embodiments, the first conductivity type of the first type region 104 comprises an n-type material, n+ type material, n++ type material, n-type dopants such as Phosphorous, Arsenic, Antimony, etc., alone or in combination. According to some embodiments, the first type region 104 comprises a source region. According to some embodiments, the first type region 104 comprises a drain region. In some embodiments, the well region 102 and first type region 104 comprise different conductivity types. In some embodiments, the well region 102 comprises a p-type material, p+ type material, p++ type material, p-type dopants such as Boron, Gallium, Indium, etc., alone or in combination and the first type region 104 comprises an n-type material, n+ type material, n++ type material, n-type dopants such as Phosphorous, Arsenic, Antimony, etc., alone or in combination. In some embodiments, the well region 102 comprises an n-type material, n+ type material, n++ type material, n-type dopants such as Phosphorous, Arsenic, Antimony, etc., alone or in combination and the first type region 104 comprises a p-type material, p+ type material, p++ type material, p-type dopants such as Boron, Gallium, Indium, etc., alone or in combination.

According to some embodiments, the semiconductor device 100 comprises a channel region 110 extending between a first end 112 and a second end 114. The channel region 110 comprises any number of materials, such as, for example, silicon, polysilicon, germanium, SiGe, III-V semiconductors (GaAs, InAs, InGaAs, etc.) etc., alone or in combination. In some embodiments, the channel region 110 projects from the first type region 104. The channel region 110 is formed in any number of ways, such as by deposition, epitaxial growth, etching, etc., for example. In some embodiments, the channel region 110 comprises a p-type material, p+ type material, p++ type material, etc. In some embodiments, the channel region 110 comprises an n-type material, n+ type material, n++ type material, etc. In an embodiment, the channel region 110 comprises a nanowire, such as a vertical nanowire, etc.

According to some embodiments, a mask region 120 is formed over the channel region 110. The mask region 120 includes any number of materials, including silicon oxide, silicon nitride, etc., alone or in combination. In some embodiments, the mask region 120 extends across the second end 114 of the channel region 110.

Figure 2:
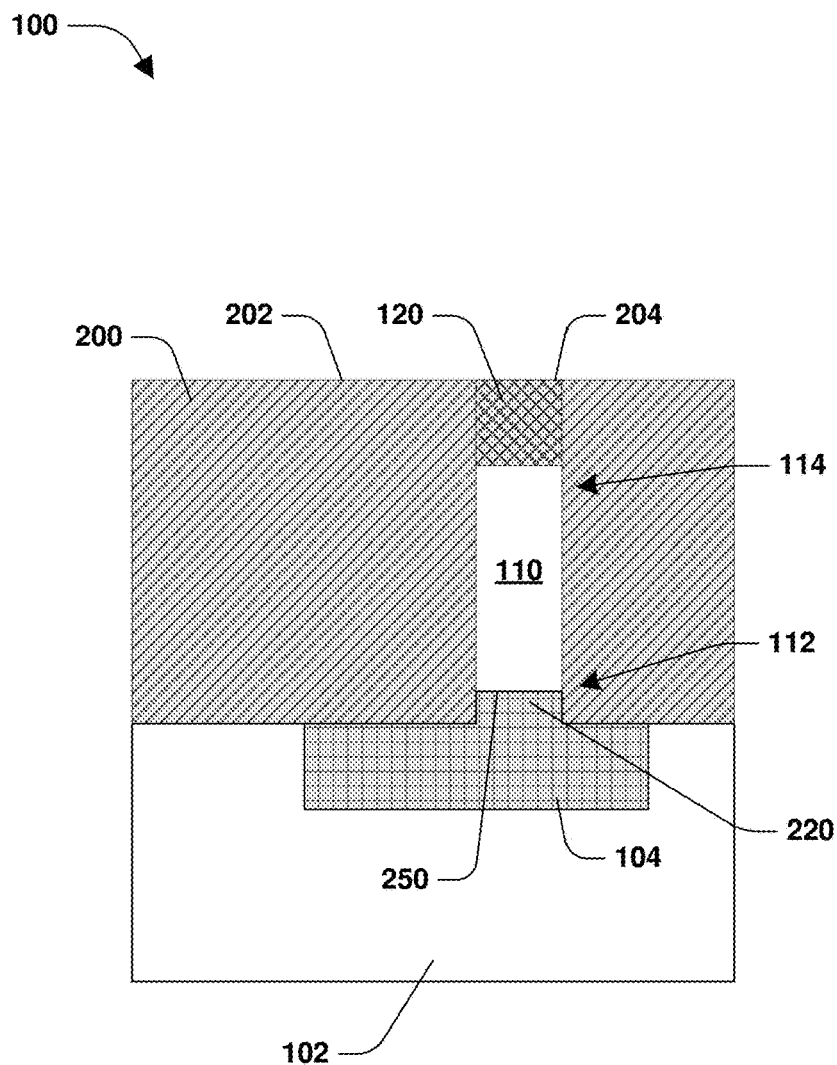
FIG. 2 illustrates a portion of a semiconductor device, according to an embodiment.

Turning now to FIG. 2, in an embodiment, a first dielectric region 200 is formed over the well region 102, the first type region 104, the channel region 110, and the mask region 120. The first dielectric region 200 is formed in any number of ways, such as by deposition, chemical vapor deposition (CVD), spin-on, or other suitable methods, for example. The first dielectric region 200 comprises any number of materials, including, for example, oxides, silicon dioxide, silicon nitride, silicon oxynitride, etc., alone or in combination. In some embodiments, a top surface 202 of the first dielectric region 200 is planarized, such as by a chemical mechanical polishing (CMP) process. In an embodiment, the top surface 202 of the first dielectric region 200 is substantially co-planar with respect to a top surface 204 of the mask region 120.

According to some embodiments, dopants from the first type region 104 diffuse at least partially into the first end 112 of the channel region 110. In some embodiments, a diffusion portion 220 of the first type region 104 is formed extending from the first type region 104 into the channel region 110. In an embodiment, the diffusion portion 220 of the first type region 104 comprises the first conductivity type. In some embodiments, the diffusion portion 220 of the first type region 104 comprises a first type region edge 250.

Figure 3:
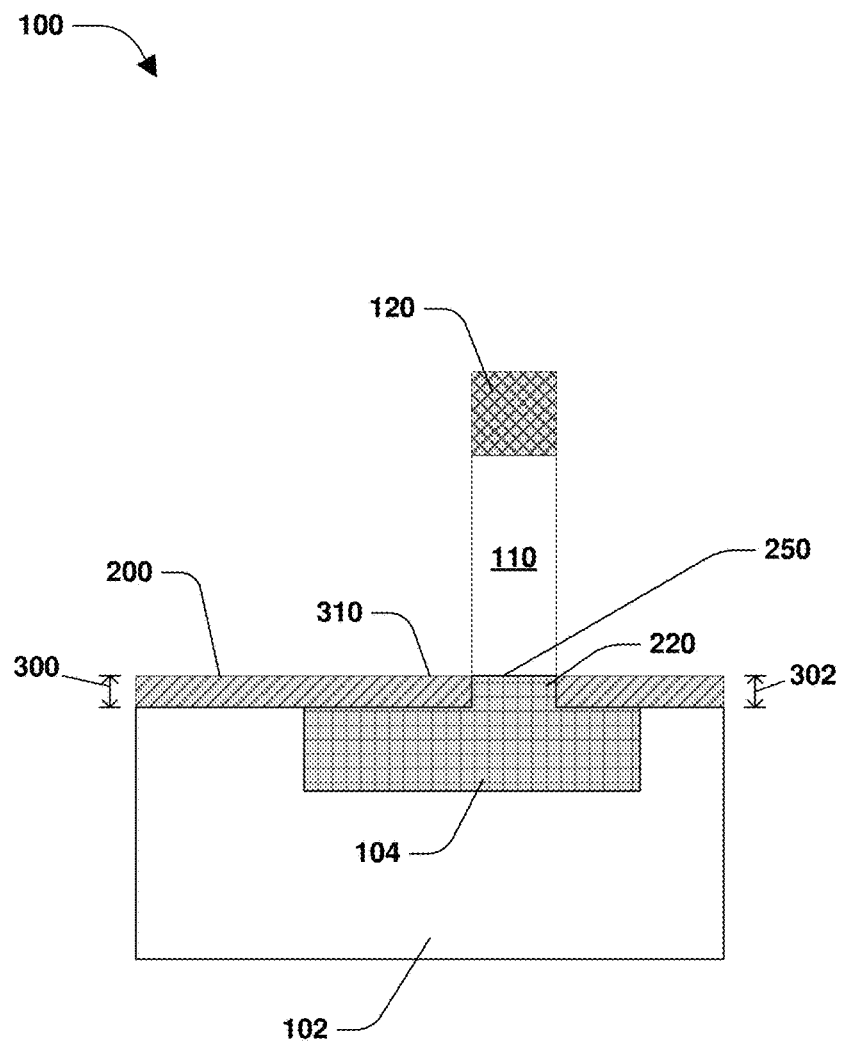
FIG. 3 illustrates a portion of a semiconductor device, according to an embodiment.

Turning now to FIG. 3, in an embodiment, the first dielectric region 200 is patterned. In some embodiments, the first dielectric region 200 is patterned by etching. According to some embodiments, the first dielectric region 200 is patterned to a first height 300. In some embodiments, the first height 300 of the first dielectric region 200 substantially matches a second height 302 of the diffusion portion 220 of the first type region 104. In an embodiment, a top surface 310 of the first dielectric region 200 is substantially co-planar with respect to the first type region edge 250 of the first type region 104.

Figure 4:
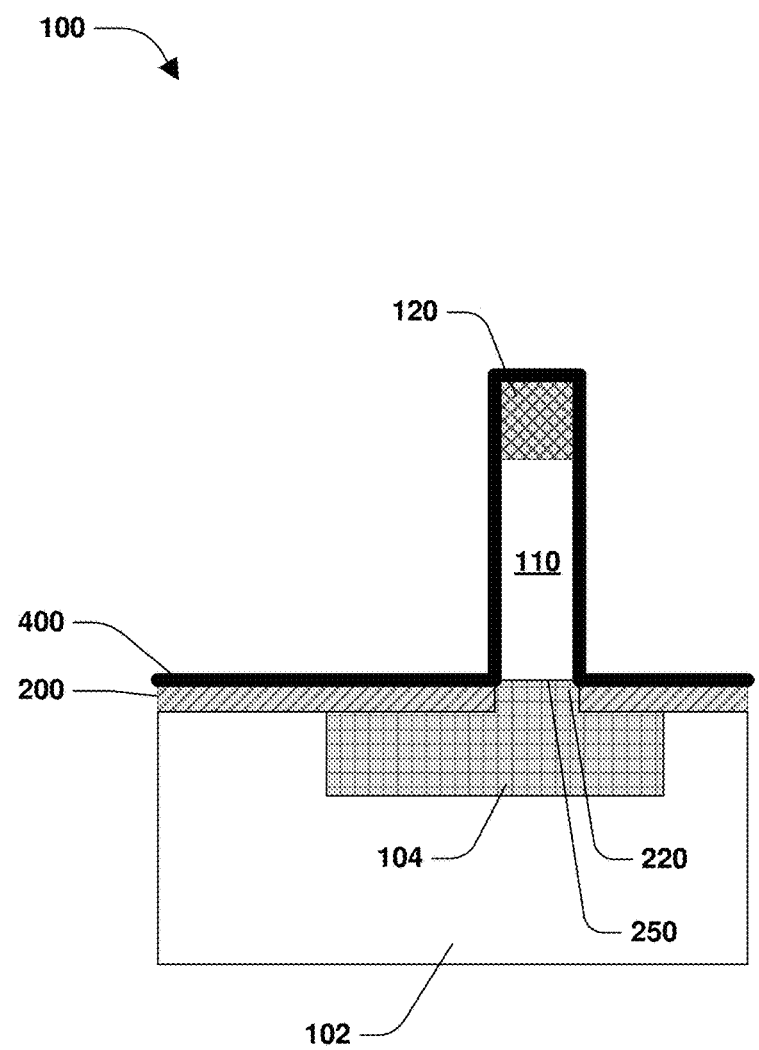
FIG. 4 illustrates a portion of a semiconductor device, according to an embodiment.

Turning now to FIG. 4, in an embodiment, a gate dielectric layer 400 is formed over the channel region 110, mask region 120, and first dielectric region 200. The gate dielectric layer 400 is formed in any number of ways, such as by atomic layer deposition (ALD), chemical vapor deposition (CVD), physical vapor deposition (PVD), or other suitable techniques, for example. The gate dielectric layer 400 comprises any number of materials, including, in some embodiments, high-k dielectric materials, oxides, silicon dioxide, etc., alone or in combination. According to some embodiments, the gate dielectric layer 400 comprises a standard dielectric material with a medium dielectric constant, such as $SiO_2$.

Figure 5:
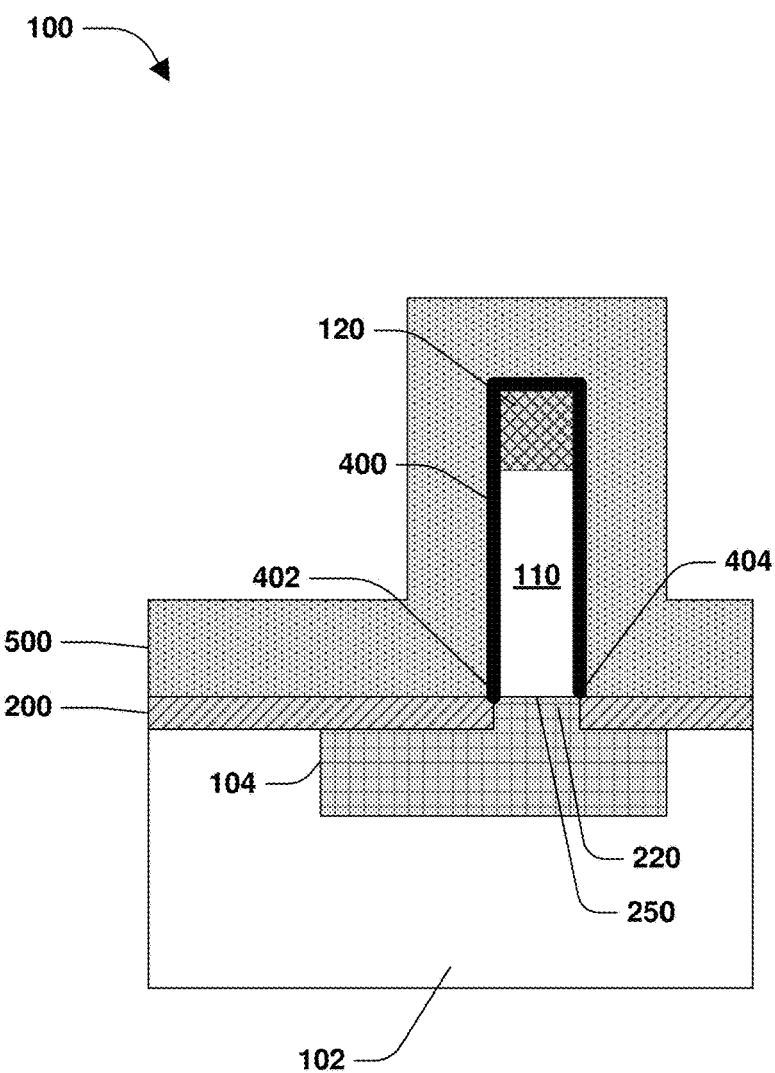
FIG. 5 illustrates forming a gate dielectric layer and a gate electrode associated with forming a semiconductor device, according to an embodiment.

Turning now to FIG. 5, in an embodiment, the gate dielectric layer 400 is patterned. In some embodiments, the gate dielectric layer 400 is patterned such that the gate dielectric layer 400 does not cover the first dielectric region 200. In an embodiment, the gate dielectric layer 400 is patterned such that a first end 402 of the gate dielectric layer 400 is located adjacent the first type region edge 250. In an embodiment, a second end 404 of the gate dielectric layer 400 is located adjacent the first type region edge 250 on an opposite side of the channel region 110. In an embodiment, the gate dielectric layer 400 covers the channel region 110 and the mask region 120.

According to some embodiments, a gate electrode 500 is formed over the first dielectric region 200 and the gate dielectric layer 400. The gate electrode 500 is formed in any number of ways, such as by deposition, atomic layer deposition (ALD), etc., for example. In some embodiments, the gate electrode 500 includes a conductive material, such as aluminum, copper, TiN, TaN, TaC, polysilicon, etc., alone or in combination. In some embodiments, the gate dielectric layer 400 is not patterned but, instead, is left intact before formation of the gate electrode 500.

Figure 6:
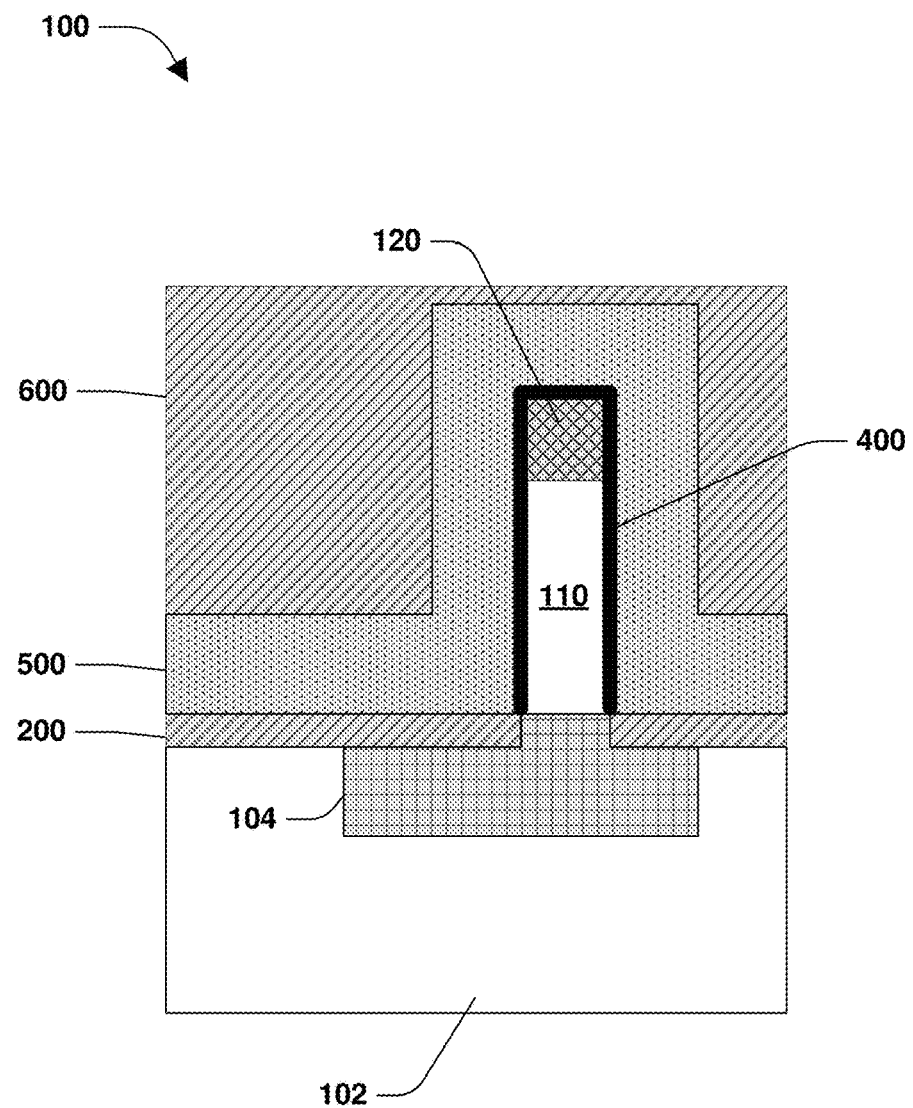
FIG. 6 illustrates a portion of a semiconductor device, according to an embodiment.

Turning now to FIG. 6, in an embodiment, a second dielectric region 600 is formed over the gate electrode 500. The second dielectric region 600 is formed in any number of ways, such as by deposition, chemical vapor deposition (CVD), or other suitable methods, for example. The second dielectric region 600 comprises any number of materials, including, for example, oxides, silicon dioxide, silicon nitride, silicon oxynitride, etc., alone or in combination. In an embodiment, the second dielectric region 600 is made planar using a technique such as a chemical-mechanical polishing (CMP).

Figure 7:
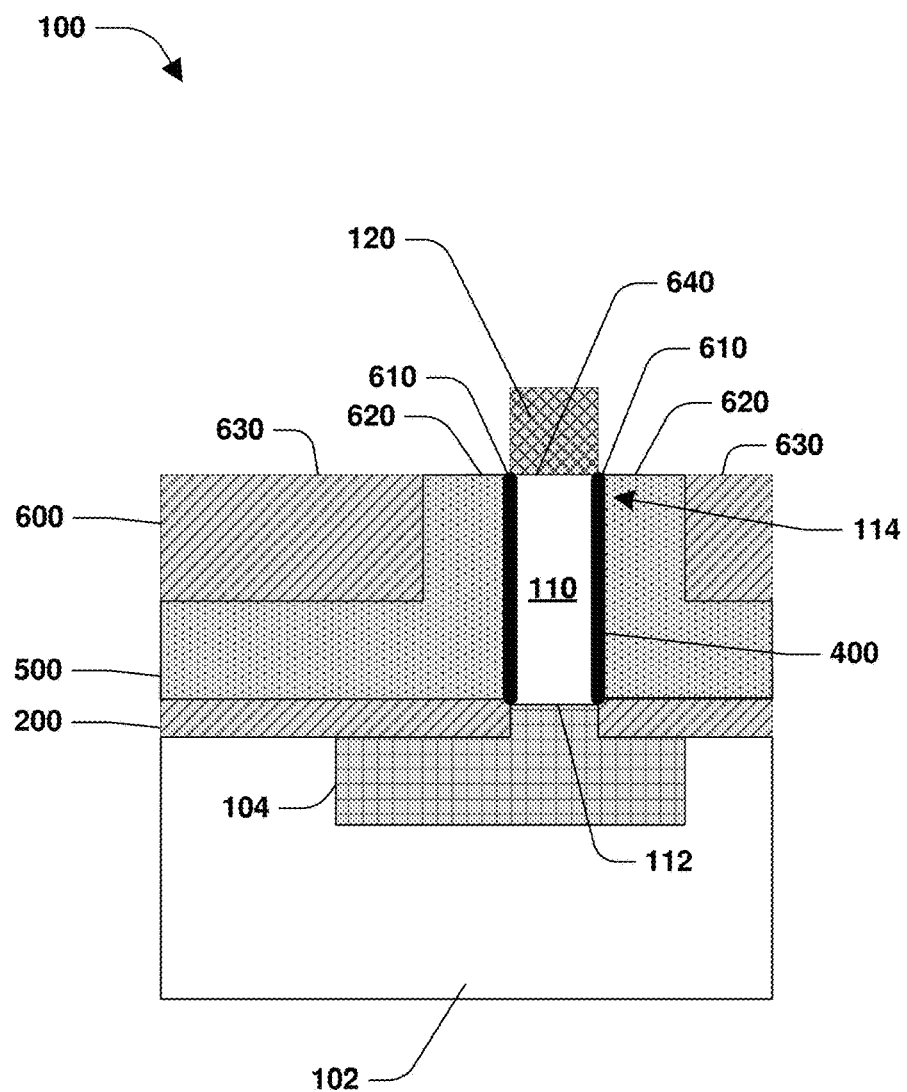
FIG. 7 illustrates a portion of a semiconductor device, according to an embodiment.

Turning now to FIG. 7, in some embodiments, portions of the gate dielectric layer 400, gate electrode 500, and second dielectric region 600 are removed, such as by etching. According to some embodiments, a top surface 610 of the gate dielectric layer 400, a top surface 620 of the gate electrode 500, and a top surface 630 of the second dielectric region 600 are substantially co-planar. According to some embodiments, after portions of the gate dielectric layer 400, gate electrode 500, and second dielectric region 600 are removed, the top surfaces 610, 620, 630, are substantially co-planar with respect to a second end channel surface 640 defined at the second end 114 of the channel region 110. In some embodiments, after portions of the gate dielectric layer 400, gate electrode 500, and second dielectric region 600 are removed, the mask region 120 is exposed above the gate dielectric layer 400, gate electrode 500, and second dielectric region 600.

Figure 8:
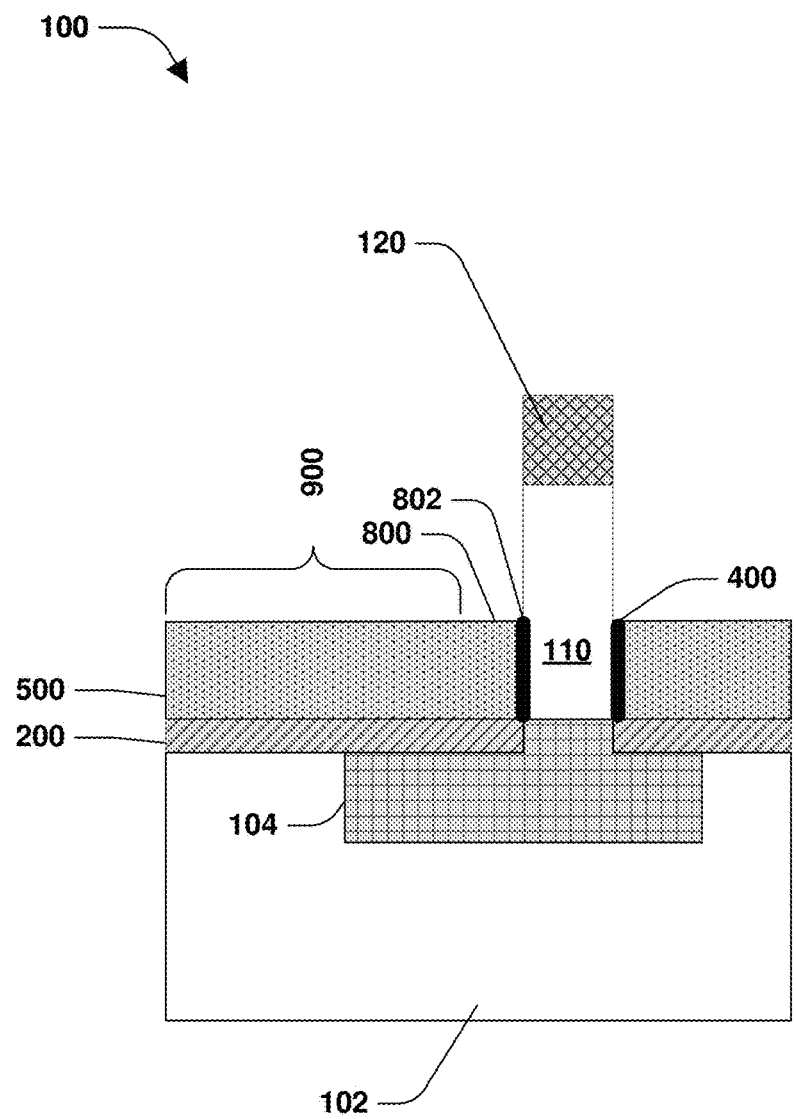
FIG. 8 illustrates a portion of a semiconductor device, according to an embodiment.

Turning now to FIG. 8, in some embodiments, the second dielectric region 600, along with portions of the gate dielectric layer 400 and gate electrode 500, are removed, such as by etching. According to some embodiments, a top surface 800 of the gate electrode 500 and a top surface 802 of the gate dielectric layer 400 are planarized.

Figure 9:
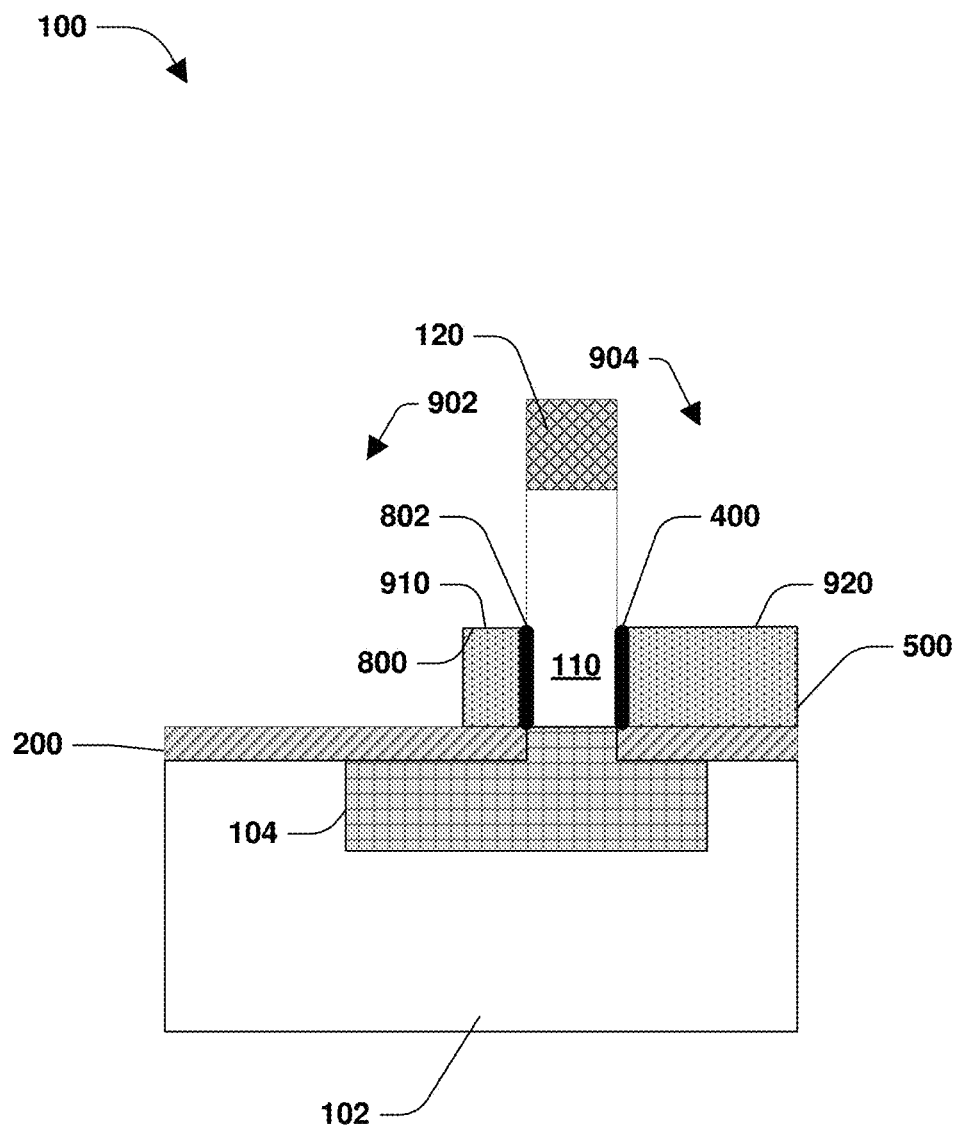
FIG. 9 illustrates a portion of a semiconductor device, according to an embodiment.

Turning now to FIG. 9, in some embodiments, a first portion 900 (illustrated in FIG. 8) of the gate electrode 500 is removed, such as by etching. According to some embodiments, the first portion 900 is located on a first side 902 of the channel region 110. In some embodiments, after removal of the first portion 900, a first gate portion 910 is located on the first side 902 of the channel region 110 and a second gate portion 920 is located on a second side 904 of the channel region 110. According to some embodiments, the gate electrode 500 surrounds the channel region 110 (illustrated in FIG. 14), such that the semiconductor device 100 comprises a gate-all-around structure.

Figure 10:
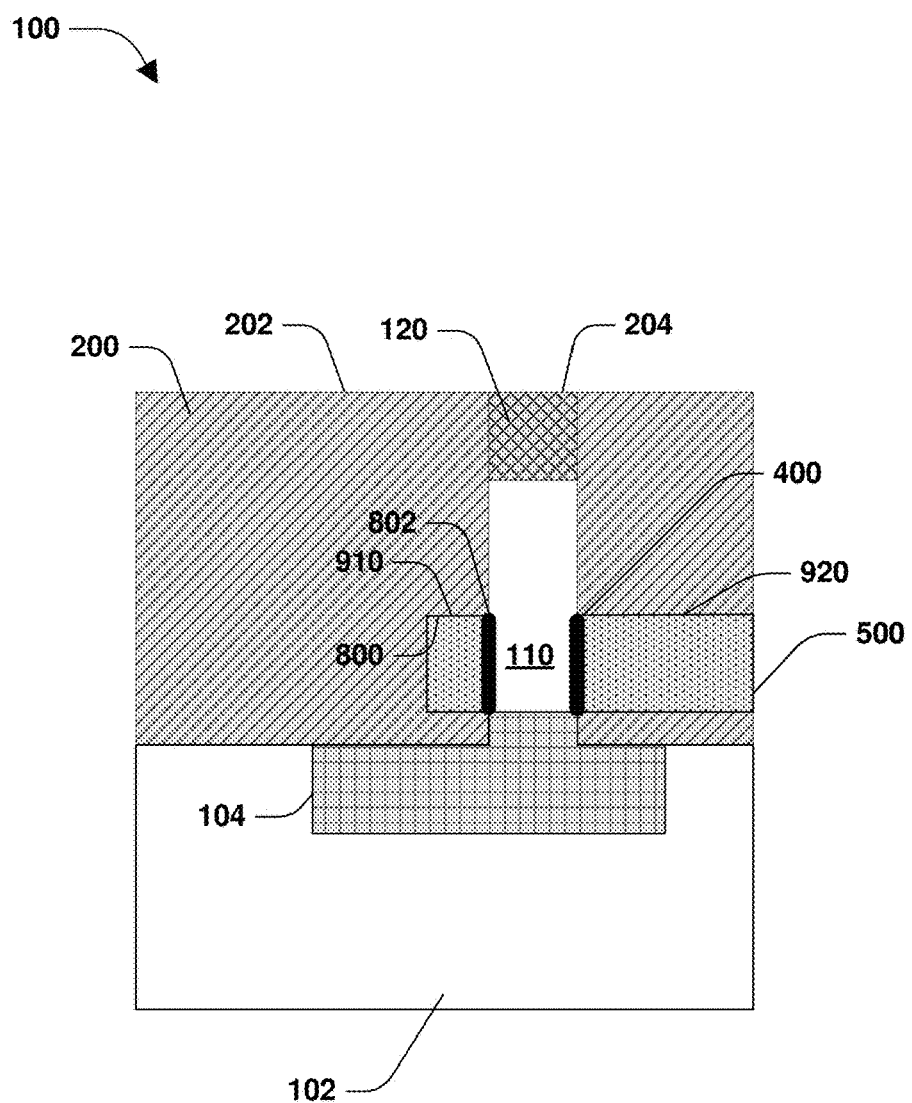
FIG. 10 illustrates a portion of a semiconductor device, according to an embodiment.

FIG. 10 illustrates the formation of the first dielectric region 200, or, rather, additional first dielectric material above the existing first dielectric region 200 (illustrated in FIG. 9) and the gate electrode 500. In an embodiment, the first dielectric region 200 is formed on top of the first gate portion 910 and second gate portion 920 of the gate electrode 500 and over the gate dielectric layer 400. In some embodiments, the top surface 202 of the first dielectric region 200 is substantially co-planar with respect to the top surface 204 of the mask region 120.

Figure 11:
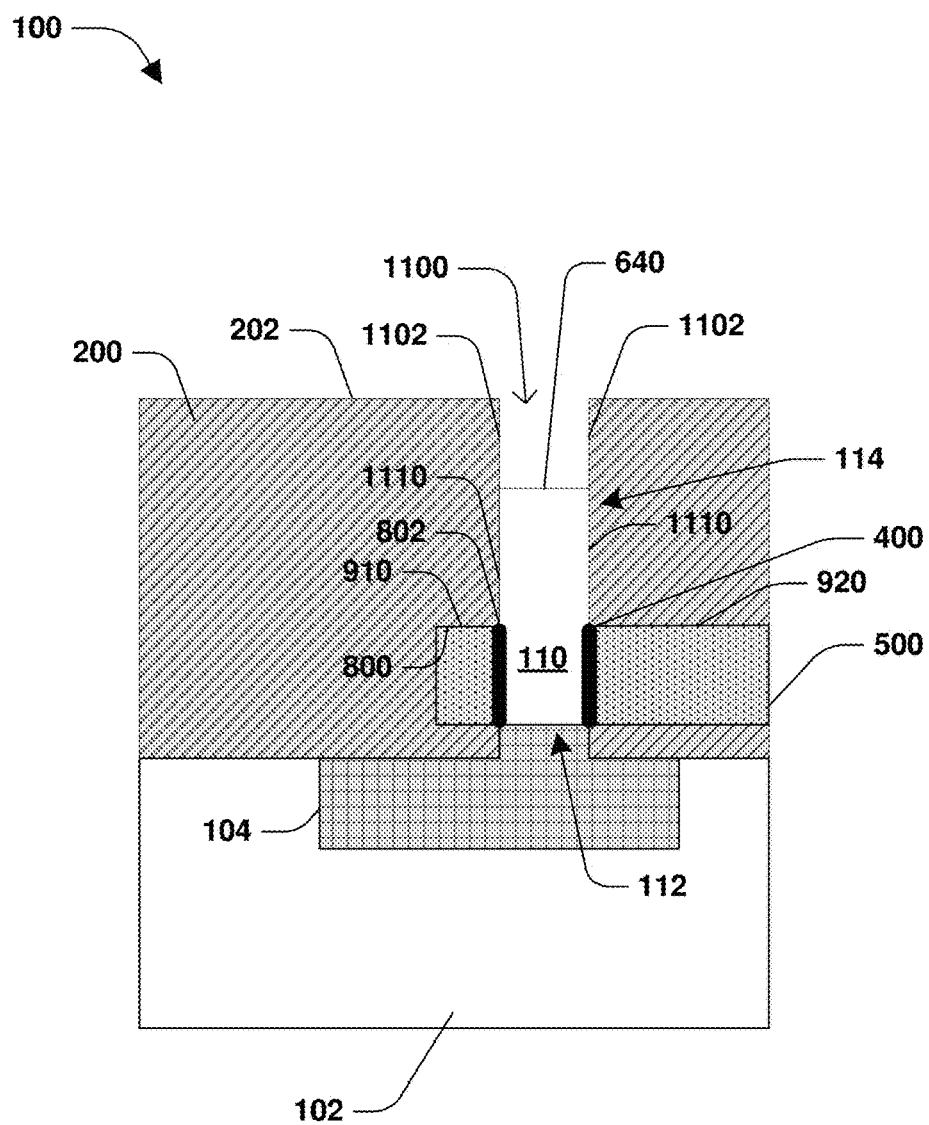
FIG. 11 illustrates a portion of a semiconductor device, according to an embodiment.

Turning to FIG. 11, in an embodiment, an opening 1100 is formed in the first dielectric region 200. In some embodiments, the opening 1100 is formed by removing the mask region 120. The mask region 120 is removed in any number of ways, such as by etching, for example. According to some embodiments, the opening 1100 is formed to the second end channel surface 640 at the second end 114 of the channel region 110. In some embodiments, the opening 1100 is formed such that sidewalls 1102 defining the opening 118 are located in line with and above sides 1110 of the channel region 110.

Figure 12:
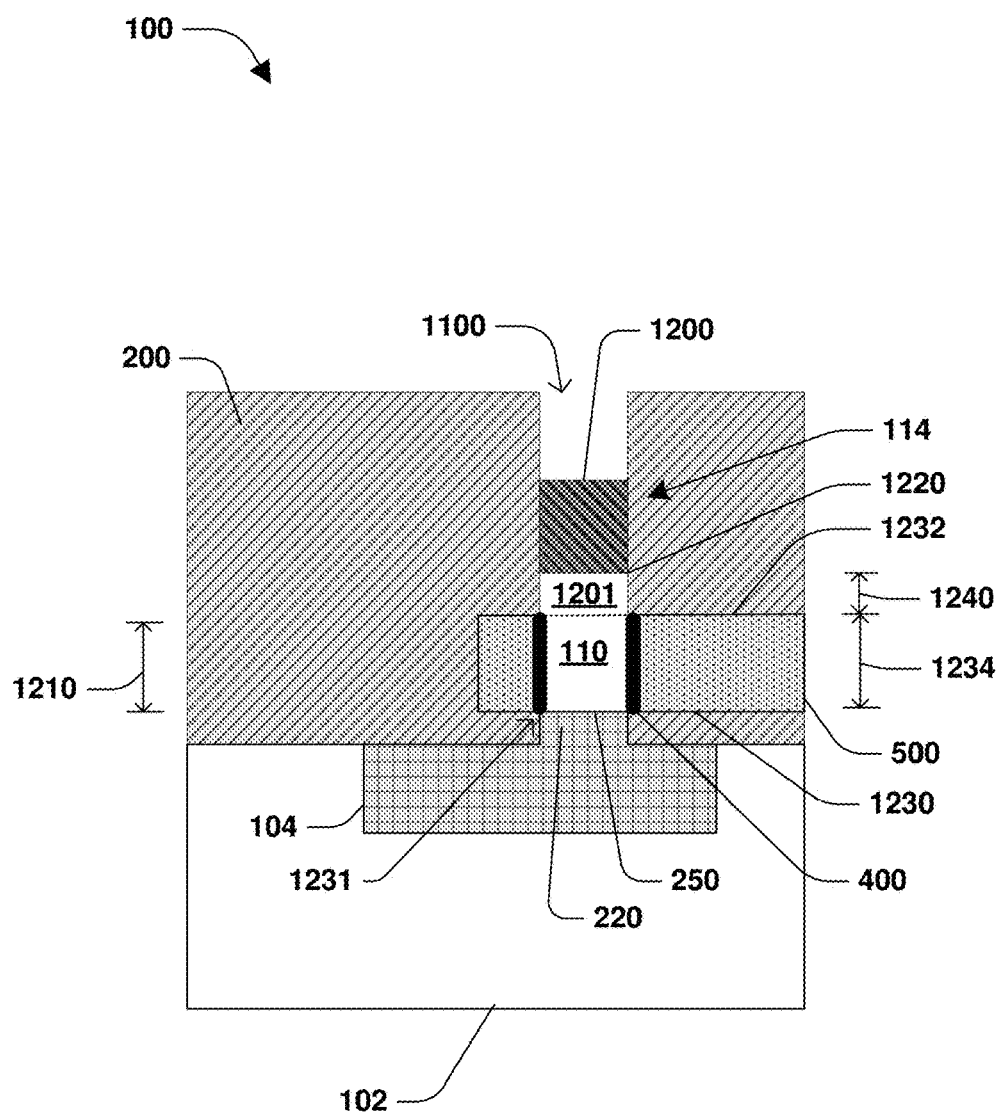
FIG. 12 illustrates forming a second type region associated with forming a semiconductor device, according to an embodiment.

Turning now to FIG. 12, in some embodiments, a second type region 1200 is formed. The second type region 1200 is formed in any number of ways. According to some embodiments, the second type region 1200 is formed by doping the second end 114 of the channel region 110. According to some embodiments, the second type region 1200 comprises a second conductivity type. In some embodiments, the second conductivity type of the second type region 1200 comprises a p-type material, p+ type material, p++ type material, p-type dopants such as Boron, Gallium, Indium, etc., alone or in combination. In some embodiments, the second conductivity type of the second type region 1200 comprises an n-type material, n+ type material, n++ type material, n-type dopants such as Phosphorous, Arsenic, Antimony, etc., alone or in combination. According to some embodiments, the second type region 1200 comprises a source region. In an embodiment, doping of the second type region 1200 is achieved using implantation, plasma doping, deposition of doped silicide, or any other method(s). In an embodiment, the second type region 1200 is formed using doped epitaxy or selective epitaxy. According to some embodiments, the second type region 1200 comprises a drain region.

According to some embodiments, the first conductivity type of the first type region 104 is substantially similar to the second conductivity type of the second type region 1200. In an embodiment, the first conductivity type of the first type region 104 and the second conductivity type of the second type region 1200 comprise a p-type material, p+ type material, p++ type material, p-type dopants such as Boron, Gallium, Indium, etc., alone or in combination. In an embodiment, the first conductivity type of the first type region 104 and the second conductivity type of the second type region 1200 comprise an n-type material, n+ type material, n++ type material, n-type dopants such as Phosphorous, Arsenic, Antimony, etc., alone or in combination.

In some embodiments, after the second type region 1200 is formed, a drift region 1201 exists between the channel region 110 and the second type region 1200. According to some embodiments, the drift region 1201 comprises a material or composition similar to a material or composition of the channel region 110. In an embodiment, the drift region 1201 extends between the channel region 110 and the second type region 1200.

In some embodiments, the channel region 110 extends between the first type region 104 and the second type region 1200 and is substantially surrounded by the gate electrode 500. In an embodiment, a channel length 1210 of the channel region 110 is measured between the first type region edge 250 of the first type region 104 and the drift region 1201. According to some embodiments, the channel length 1210 of the channel region 110 is between about 5 nm to about 40 nm.

According to some embodiments, the gate electrode 500 extends between a first gate edge 1230 and a second gate edge 1232. In an embodiment, the gate electrode 500 comprises a gate length 1234 measured between the first gate edge 1230 and the second gate edge 1232. In an embodiment, the gate length 1234 of the gate electrode 500 is between about 5 nm to about 25 nm. In some embodiments, the gate length 1234 of the gate electrode 500 substantially matches the channel length 1210 of the channel region 110.

According to some embodiments, the gate electrode 500 is separated from the first type region 104. In some embodiments, the first gate edge 1230 of the gate electrode 500 is separated a first distance 1231 from the first type region edge 250 of the first type region 104. In some embodiments, the first distance 1231 is between 0 nm to about 3 nm. In an embodiment, as illustrated in FIG. 12, the first gate edge 1230 is substantially co-planar with and not spaced apart from the first type region edge 250, such that the first distance 1231 is about 0 nm. In some embodiments, not illustrated in FIG. 12, the gate electrode 500 overlaps at least some of the diffusion portion 220 of the first type region 104, such that the first gate edge 1230 of the gate electrode 500 is not co-planar with the first type region edge, but is instead located below first type region edge 250.

According to some embodiments, the gate electrode 500 is separated from the second type region 1200. In some embodiments, the second gate edge 1232 of the gate electrode 500 is separated a second distance 1240 from the second type region edge 1220 of the second type region 1200. In some embodiments, the second distance 1240 is between about 2 nm to about 7 nm. In some embodiments, the second distance 1240 is about 20% to about 70% of the channel length 1210 of the channel region 110. According to some embodiments, the first distance 1231 is less than the second distance 1240. According to some embodiments, the second distance 1240 substantially matches a length of the drift region 1201.

Figure 13:
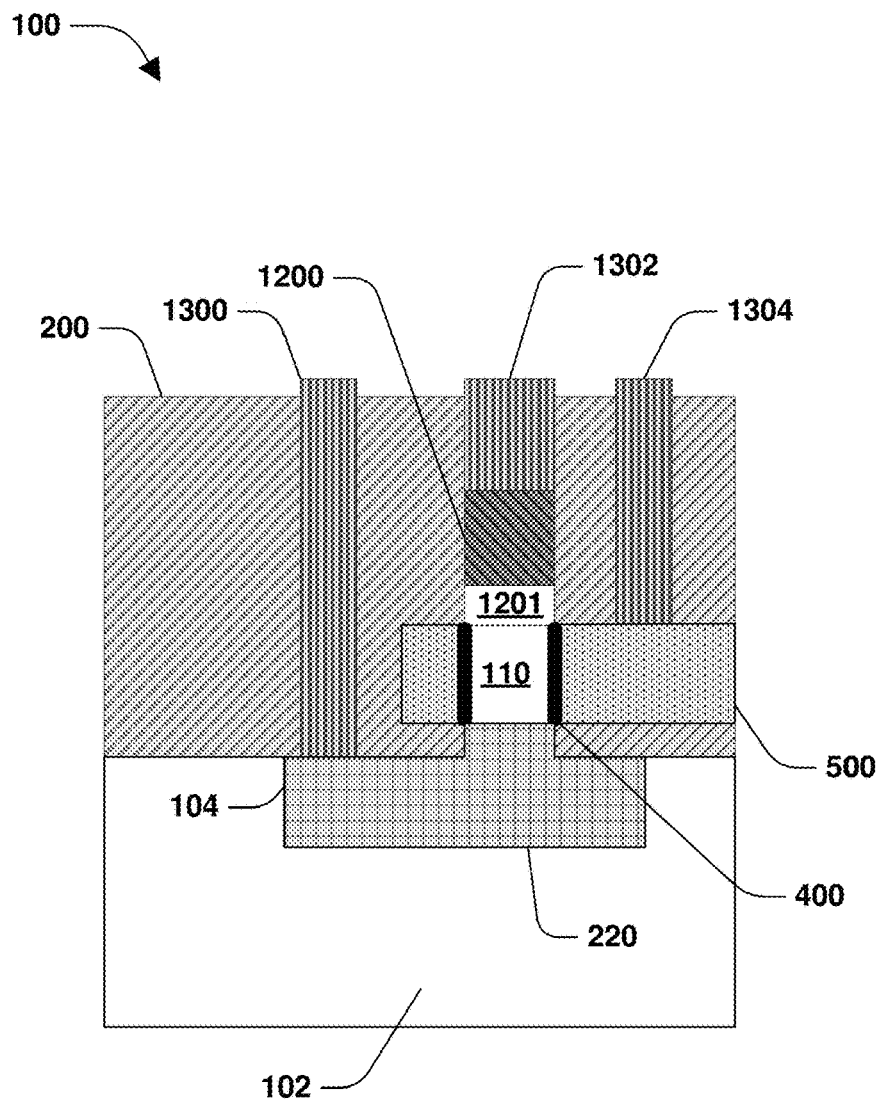
FIG. 13 illustrates forming a first type region contact, a second type region contact, and a gate contact associated with forming a semiconductor device, according to an embodiment.

Turning now to FIG. 13, according to some embodiments, the first dielectric region 200 is patterned to form a plurality of openings for a first type region contact 1300, second type region contact 1302, and a gate contact 1304. In an embodiment, the first type region contact 1300, second type region contact 1302, and gate contact 1304 comprise a conductive material. In some embodiments, the first type region contact 1300 is formed in contact with the first type region 104. In some embodiments, the second type region contact 1302 is formed in contact with the second type region 1200. In some embodiments, the gate contact 1304 is formed in contact with the gate electrode 500. According to some embodiments, when a sufficient voltage ($V_g$) is applied to the gate contact 1304, current will flow through the channel region 110 between the first type region 104 and the second type region 1200 and thus between the first type region contact 1300 and the second type region contact 1302.

Figure 14:
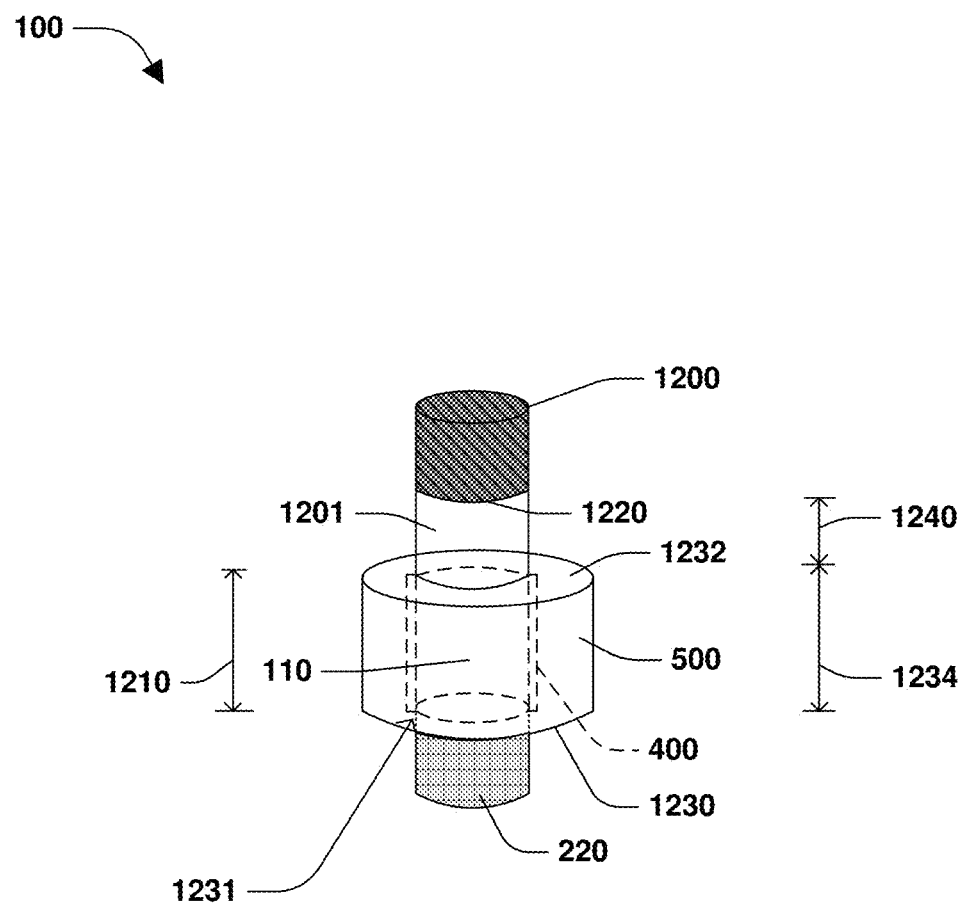
FIG. 14 illustrates a portion of a semiconductor device, according to an embodiment.

FIG. 14 is a perspective view of an embodiment of the semiconductor device 100, but where the well region 102, first dielectric region 200, first type region contact 1300, second type region contact 1302, gate contact 1304, and first type region 104, other than diffusion portion 220, are not illustrated.

In an embodiment, the gate electrode 500 surrounds at least some of the channel region 110. In some embodiments, the gate electrode 500 comprises the gate length 1234 and, thus, surrounds a length of the channel region 110 that corresponds to the gate length 1234. In some embodiments, the gate dielectric layer 400 also surrounds the channel region 110 and has a length corresponding to the gate length 1234. In some embodiments, the second gate edge 1232 of the gate electrode 500 is separated by the second distance 1240 from the second type region edge 1220 of the second type region 1200. According to some embodiments, the first distance 1231 is less than the second distance 1240. Accordingly, in some embodiments, the gate electrode 500 is closer to one of the first type region 104 (illustrated as the diffusion portion 220 of the first type region 104) or the second type region 1200, such that the semiconductor device 100 comprises an asymmetric semiconductor device.

Figure 15:
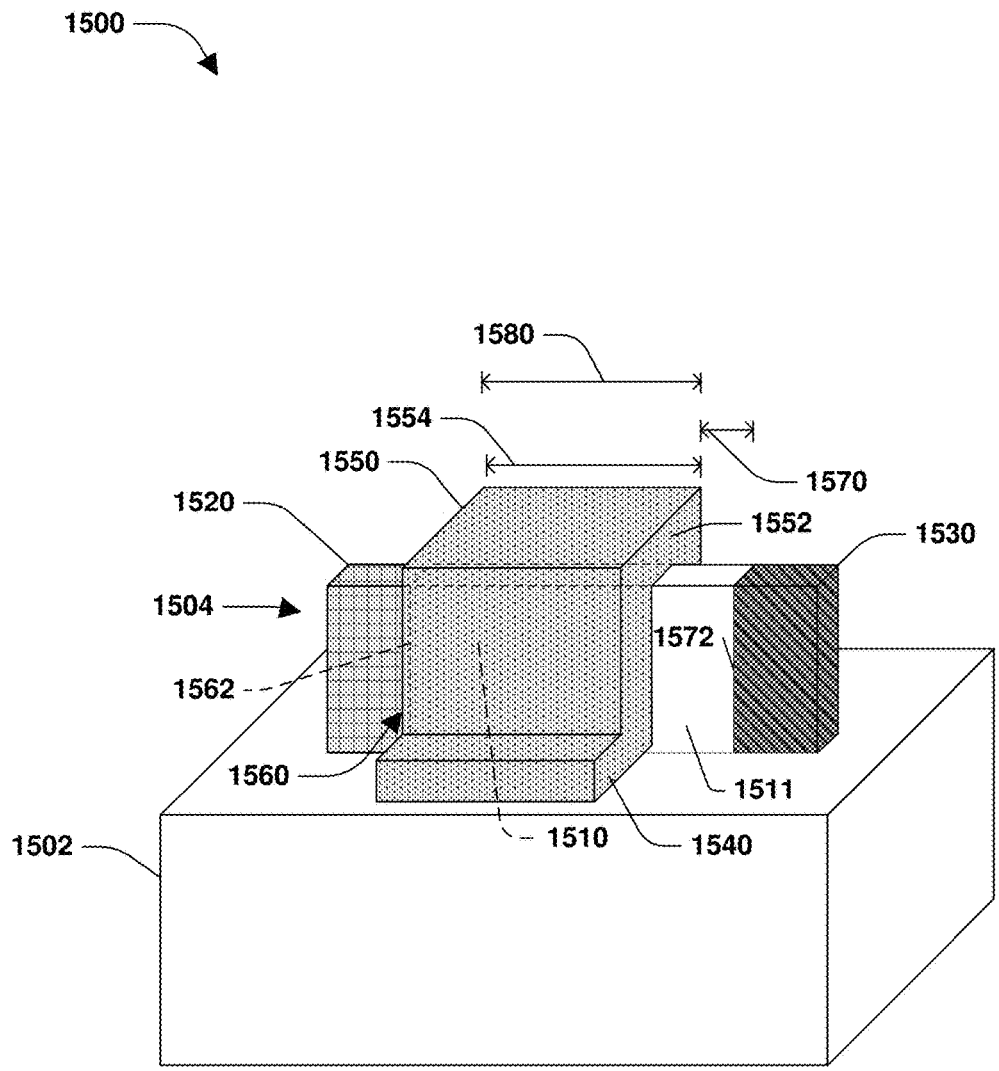
FIG. 15 illustrates a semiconductor device, according to an embodiment.

FIG. 15 illustrates a second example semiconductor device 1500. According to some embodiments, the second semiconductor device 1500 is formed on a substrate region 1502. The substrate region 1502 comprises any number of materials, such as, for example, silicon, polysilicon, germanium, III—V alloy semiconductors such as GaAs, InAs, InGaAs, etc., alone or in combination. According to some embodiments, the substrate region 1502 comprises an epitaxial layer, wafer, die formed from a wafer, etc.

According to some embodiments, the second semiconductor device 1500 comprises a finFET device. In an embodiment, the second semiconductor device 1500 comprises a fin 1504 formed on the substrate region 1502. In some examples, a channel region 1510 is comprised within a portion of the fin 1504. In some embodiments, the channel region 1510 comprises a p-type material, p+ type material, p++ type material, p-type dopants such as Boron, Indium, Gallium, etc., alone or in combination. In some embodiments, the channel region 1510 comprises an n-type material, n+ type material, n++ type material, n-type dopants such as Phosphorous, Arsenic, Antimony, etc., alone or in combination.

According to some embodiments, the second semiconductor device 1500 comprises a first type region 1520 formed on the substrate region 1502. According to some embodiments, the first type region 1520 comprises a first portion of the fin 1504. In some embodiments, the first type region 1520 is located on a first side of the channel region 1510. In some embodiments, the first type region 1520 comprises a first conductivity type. In some embodiments, the first conductivity type of the first type region 1520 comprises a p-type material, p+ type material, p++ type material, p-type dopants such as Boron, Indium, Gallium, etc., alone or in combination. In some embodiments, the first conductivity type of the first type region 1520 comprises an n-type material, n+ type material, n++ type material, n-type dopants such as Phosphorous, Arsenic, Antimony, etc., alone or in combination. According to some embodiments, the first type region 1520 comprises a source region. According to some embodiments, the first type region 1520 comprises a drain region.

In some embodiments, the second semiconductor device 1500 comprises a drift region 1511 that exists on the substrate region 1502. According to some embodiments, the drift region 1511 extends between the channel region 1510 and a second type region 1530. According to some embodiments, the drift region 1511 comprises a material or material or composition similar to that of the channel region 1510.

According to some embodiments, the second semiconductor device 1500 comprises the second type region 1530 formed on the substrate region 1502. According to some embodiments, the second type region 1530 comprises a second portion of the fin 1504. In some embodiments, the second type region 1530 is located on a second side of the channel region 1510 opposite the first side of the channel region 1510. According to some embodiments, the channel region 1510 extends between the first type region 1520 and the second type region 1530, with the drift region 1511 extending between the channel region 1510 and the second type region 1530. In some embodiments, the second type region 1530 comprises a second conductivity type. In some embodiments, the second conductivity type of the second type region 1530 comprises a p-type material, p+ type material, p++ type material, p-type dopants such as Boron, Indium, Gallium, etc., alone or in combination. In some embodiments, the second conductivity type of the second type region 1530 comprises an n-type material, n+ type material, n++ type material, n-type dopants such as Phosphorous, Arsenic, Antimony, alone or in combination. According to some embodiments, the second type region 1530 comprises a source region. According to some embodiments, the second type region 1530 comprises a drain region.

According to some embodiments, the first conductivity type of the first type region 1520 is substantially similar to the second conductivity type of the second type region 1530. In an embodiment, the first conductivity type of the first type region 1520 and the second conductivity type of the second type region 1530 comprise a p-type material, p+ type material, p++ type material, p-type dopants such as Boron, Indium, Gallium, etc., alone or in combination. In an embodiment, the first conductivity type of the first type region 1520 and the second conductivity type of the second type region 1530 comprise an n-type material, n+ type material, n++ type material, n-type dopants such as Phosphorous, Arsenic, Antimony, etc., alone or in combination.

According to some embodiments, the second semiconductor device 1500 comprises a gate electrode 1540 surrounding at least some of the channel region 1510. Although not illustrated, the semiconductor device 1500 also comprises, in some embodiments, a gate dielectric layer disposed between the channel region 1510 and the gate electrode 1540 to electrically isolate the channel region 1510 from the gate dielectric layer. The gate dielectric layer is formed in any suitable manner of any suitable material having any suitable dielectric constant. The gate electrode 1540 is formed in any number of ways, such as by deposition, epitaxial growth, etc., for example. In some embodiments, the gate electrode 1540 includes a conductive material, such as aluminum, polysilicon, TiN, TaC, TaN, etc., alone or in combination.

According to some embodiments, the gate electrode 1540 extends between a first gate edge 1550 and a second gate edge 1552. In an embodiment, the gate electrode 1540 comprises a gate length 1554 measured between the first gate edge 1550 and the second gate edge 1552. In an embodiment, the gate length 1554 of the gate electrode 1540 is between about 5 nm to about 25 nm.

According to some embodiments, the gate electrode 1540 is separated from the first type region 1520. In some embodiments, the first gate edge 1550 of the gate electrode 1540 is separated a first distance 1560 from a first type region edge 1562 of the first type region 1520. In some embodiments, the first distance 1560 is between 0 nm to about 1 nm. In an embodiment, as illustrated in FIG. 15, the first gate edge 1550 is substantially adjacent to and not spaced apart from the first type region edge 1562, such that the first distance 1560 is about 0 nm.

According to some embodiments, the gate electrode 1540 is separated from the second type region 1530. According to some embodiments, the second gate edge 1552 is separated a second distance 1570 from a second type region edge 1572 of the second type region 1530. In some embodiments, the second distance 1570 is between about 2 nm to about 7 nm. In some embodiments, the second distance 1570 is about 20% to about 70% of a channel length 1580 of the channel region 110. According to some embodiments, the first distance 1560 is less than the second distance 1570. According to some embodiments, the second distance 1570 substantially matches a length of the drift region 1511.

In some embodiments, the channel length 1580 of the channel region 1510 is between about 20 nm to about 40 nm. In an embodiment, the channel length 1580 of the channel region 1510 is measured between the first type region edge 1562 of the first type region 1520 and the drift region 1511. In some embodiments, the gate length 1554 of the gate electrode 1540 substantially matches the channel length 1580 of the channel region 1510.

Figure 16:
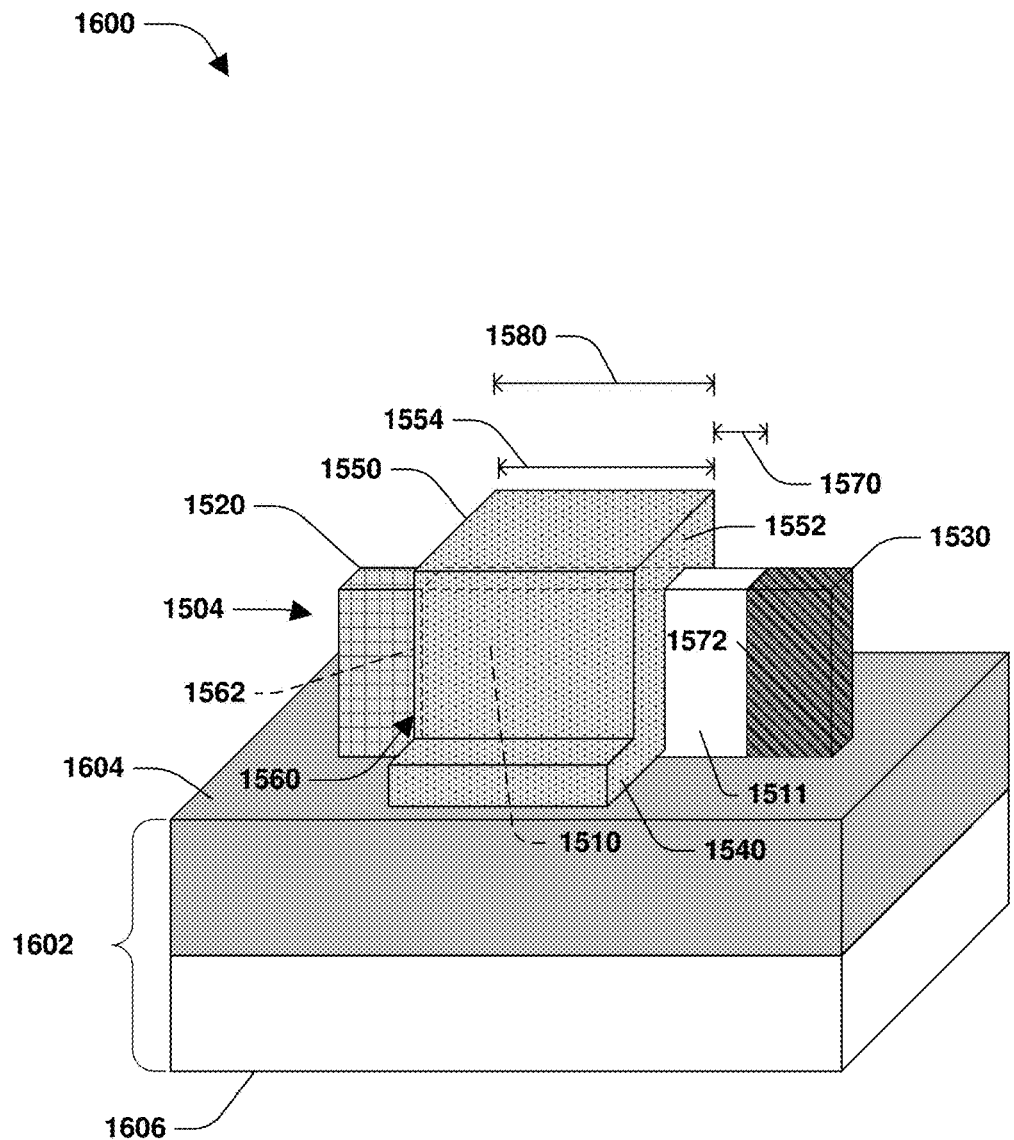
FIG. 16 illustrates a semiconductor device, according to an embodiment.

FIG. 16 illustrates a third example semiconductor device 1600. According to some embodiments, the third semiconductor device 1600 comprises the channel region 1510, first type region 1520, second type region 1530, gate dielectric layer, and the gate electrode 1540. In some embodiments, the third semiconductor device 1600 is formed on a substrate region 1602. According to some embodiments, the substrate region 1602 comprises a silicon-on-insulator (SOI) structure. In an embodiment, the substrate region 1602 comprises an insulator layer 1604. The insulator layer 1604 includes any number of materials, including oxides, $SiO_2$, etc. In some embodiments, the insulator layer 1604 is formed on a substrate layer 1606. The substrate layer 1606 includes any number of materials, including silicon, polysilicon, germanium, etc., alone or in combination.

According to some embodiments, the semiconductor device 100, 1500, 1600 is asymmetric due to the gate electrode 500, 1540 being located a shorter distance to one of the first type region 104, 1520 or the second type region 1200, 1530 as compared to the other type region. In some embodiments, the semiconductor device 100, 1500, 1600 exhibits reduced short channel effects through the channel region 110, 1510 as compared to a non-asymmetric device. Additionally, in some embodiments, the semiconductor device 100, 1500, 1600 exhibits a current drive through the channel region 110, 1510 that is equal to or greater than a current drive in a non-asymmetric device.

Figure 17:
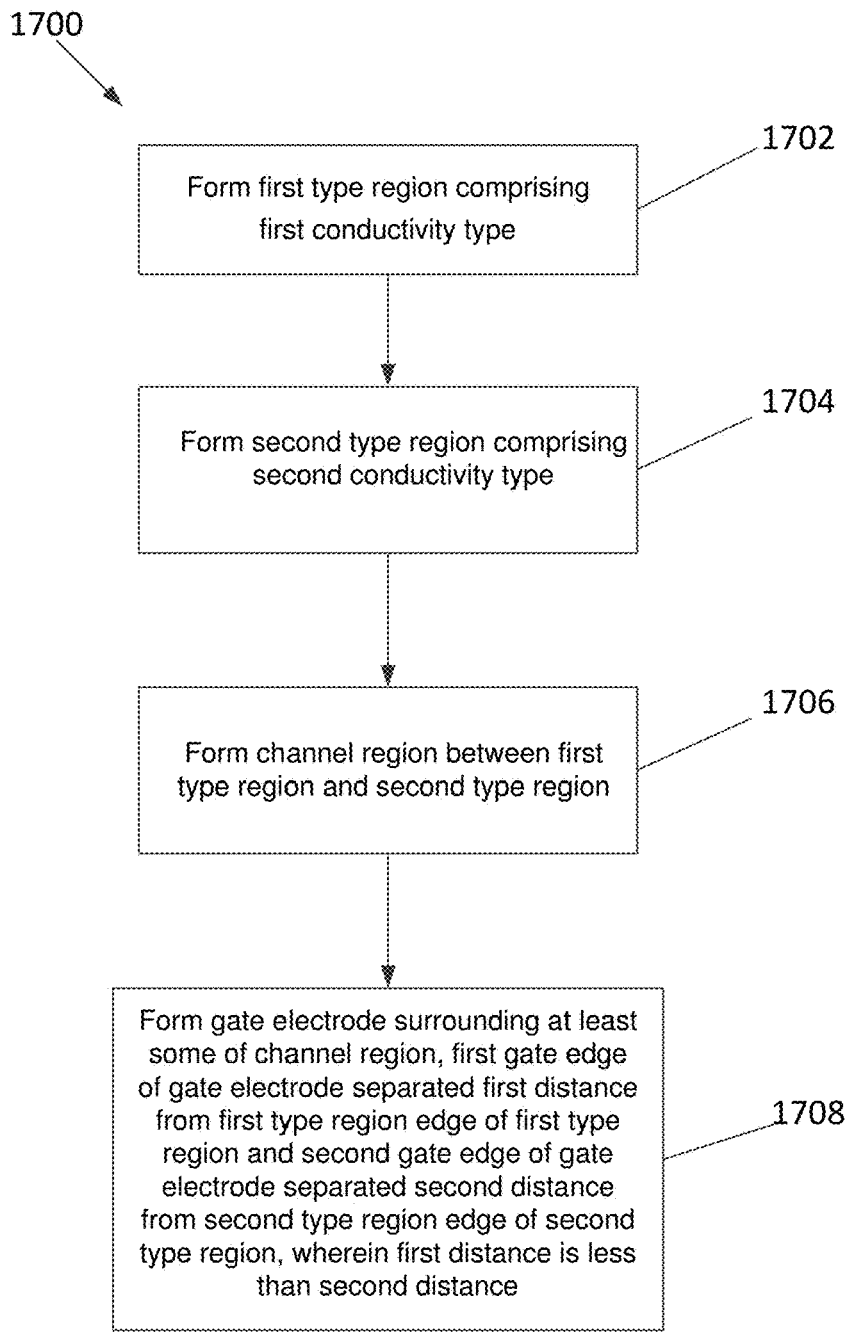
FIG. 17 illustrates a method of forming a semiconductor device, according to an embodiment.

An example method 1700 of forming a semiconductor device, such as semiconductor device 100, 1500, 1600, according to some embodiments, is illustrated in FIG. 17. At 1702, the first type region 104, 1520 is formed comprising the first conductivity type. At 1704, the second type region 1200, 1530 is formed comprising the second conductivity type. At 1706, the channel region 110, 1510 is formed between the first type region 104, 1520 and the second type region 1200, 1530. At 1708, the gate electrode 500, 1540 is formed surrounding at least some of the channel region 110, 1510, with the first gate edge 1230, 1550 of the gate electrode 500, 1540 separated the first distance 1231, 1560 from the first type region edge 250, 1562 of the first type region 104, 1520 and the second gate edge 1232, 1552 of the gate electrode 500, 1540 separated the second distance 1240, 1570 from the second type region edge 1220, 1572 of the second type region 1200, 1530, wherein the first distance 1231, 1560 is less than the second distance 1240, 1570.

In an embodiment, a semiconductor device comprises a first type region comprising a first conductivity type and a second type region comprising a second conductivity type. In an embodiment, the semiconductor device comprises a channel region extending between the first type region and the second type region. In an embodiment, the semiconductor device comprises a gate electrode surrounding at least some of the channel region. In an embodiment, a first gate edge of the gate electrode is separated a first distance from a first type region edge of the first type region and a second gate edge of the gate electrode is separated a second distance from a second type region edge of the second type region. In an embodiment, the first distance is less than the second distance.

In an embodiment, the semiconductor device comprises a first type region comprising a first conductivity type and a second type region comprising a second conductivity type. In an embodiment, the semiconductor device comprises a channel region extending between the first type region and the second type region. In an embodiment, the semiconductor device comprises a gate electrode surrounding at least some of the channel region. In an embodiment, a second gate edge of the gate electrode is separated a second distance from a second type region edge of the second type region. In an embodiment, the second distance is about 20% to about 70% of a channel length of the channel region.

In an embodiment, a method of forming a semiconductor device comprises forming a first type region comprising a first conductivity type. In an embodiment, the method comprises forming a second type region comprising a second conductivity type. In an embodiment, the method comprises forming a channel region between the first type region and the second type region. In an embodiment, the method comprises forming a gate electrode surrounding at least some of the channel region. In an embodiment, a first gate edge of the gate electrode is separated a first distance from a first type region edge of the first type region and a second gate edge of the gate electrode is separated a second distance from a second type region edge of the second type region. In an embodiment, the first distance is less than the second distance.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first type region and a second type region generally correspond to first type region A and second type region B or two different or two identical type regions or the same type region.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
   forming a semiconductor column from a substrate;
   forming a first type region that interfaces with a first end of the semiconductor column, wherein the first type region comprises a first conductivity type;
   forming a dielectric over the first type region;
   forming a gate dielectric surrounding at least some of the semiconductor column and over the dielectric;
   forming a gate electrode surrounding at least some of the gate dielectric and a channel region of the semiconductor column; and
   forming a second type region over the channel region, wherein:
      a drift region is defined between the channel region and the second type region, and
      an uppermost surface of the gate electrode is at or below an interface between the drift region and the channel region.

2. The method of claim 1, comprising:
   forming a well in the substrate, wherein the well interfaces with the first type region and comprises a second conductivity type.

3. The method of claim 1, comprising:
   diffusing dopants from the first type region into the first end of the semiconductor column to define a diffusion region.

4. The method of claim 1, comprising:
   forming a mask over the semiconductor column prior to forming the dielectric, wherein the dielectric is formed over the mask.

5. The method of claim 1, comprising:
   etching the dielectric prior to forming the gate dielectric.

6. The method of claim 5, comprising:
   diffusing dopants from the first type region into the first end of the semiconductor column to define a diffusion region prior to forming the dielectric, wherein a top surface of the dielectric is substantially co-planar with a top surface of the diffusion region after etching the dielectric.

7. The method of claim 1, wherein:
   the gate dielectric and the gate electrode conceal the semiconductor column, and the method comprises:
      etching the gate dielectric and the gate electrode to expose a portion of a sidewall of the semiconductor column.

8. The method of claim 1, wherein a material composition of the gate dielectric is different than a material composition of the dielectric.

9. The method of claim 1, comprising:
   forming a mask over a second end of the semiconductor column prior to forming the gate dielectric, wherein:
      the method comprises:
         forming an additional dielectric over the gate electrode; and
         removing the mask after forming the additional dielectric to define an opening, and forming the second type region comprises doping the second end of the semiconductor column through the opening.

10. A method of forming a semiconductor device, comprising:
   forming a semiconductor column from a substrate;
   forming a first type region that interfaces with a first end of the semiconductor column, wherein the first type region comprises a first conductivity type;
   forming a dielectric over the first type region;
   forming a gate dielectric surrounding at least some of the semiconductor column and over the dielectric;
   forming a gate electrode surrounding at least some of the gate dielectric and a channel region of the semiconductor column; and
   forming a second type region over the channel region, wherein:
      a drift region is defined between the channel region and the second type region,
      a bottom surface of the gate dielectric is in contact with the dielectric, and
      the dielectric is in contact with the drift region.

11. The method of claim 10, wherein the gate electrode and the drift region are not laterally co-planar.

12. The method of claim 10, comprising:
   diffusing dopants from the first type region into the first end of the semiconductor column to define a diffusion region.

13. The method of claim 10, wherein:
   the dielectric conceals a sidewall of the semiconductor column, and
   the method comprises:
      etching the dielectric to expose a portion of the semiconductor column prior to forming the gate dielectric.

14. The method of claim 10, wherein forming the gate dielectric comprises forming the gate dielectric over the semiconductor column.

15. The method of claim 14, wherein forming the gate electrode comprises forming the gate electrode over the semiconductor column.

16. The method of claim 15, comprising:
   etching the gate dielectric and the gate electrode to expose a portion of a sidewall of the semiconductor column previously concealed by the gate dielectric and the gate electrode.

17. The method of claim 16, comprising:
   forming additional dielectric around the portion of the sidewall of the semiconductor column.

18. The method of claim 10, comprising:
   forming a mask over the semiconductor column;
   forming additional dielectric over the mask and the gate electrode; and
   removing the mask after forming the additional dielectric to define an opening.

19. The method of claim 18, wherein forming the second type region comprises doping a second end of the semiconductor column through the opening.

20. A method of forming a semiconductor device, comprising:
   forming a semiconductor column from a substrate;
   forming a first type region that interfaces with a first end of the semiconductor column, wherein the first type region comprises a first conductivity type;
   forming a dielectric over the first type region;
   forming a gate dielectric surrounding at least some of the semiconductor column and over the dielectric, wherein a material composition of the gate dielectric is different than a material composition of the dielectric;
   forming a gate electrode surrounding at least some of the gate dielectric and a channel region of the semiconductor column; and
   forming a second type region over the channel region, wherein:
      a drift region is defined between the channel region and the second type region, and
      the dielectric is in contact with the drift region.

* * * * *